US006605152B2

(12) United States Patent
Mizuishi et al.

(10) Patent No.: US 6,605,152 B2
(45) Date of Patent: Aug. 12, 2003

(54) CATCH PAN FOR MELT LEAKAGE IN APPARATUS FOR PULLING SINGLE CRYSTAL

(75) Inventors: Koji Mizuishi, Fukushima (JP); Tomohiko Ohta, Fukushima (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 0 days.

(21) Appl. No.: 09/959,593

(22) PCT Filed: Feb. 23, 2001

(86) PCT No.: PCT/JP01/01371
§ 371 (c)(1),
(2), (4) Date: Oct. 31, 2001

(87) PCT Pub. No.: WO01/64976
PCT Pub. Date: Jul. 9, 2001

(65) Prior Publication Data
US 2002/0157602 A1 Oct. 31, 2002

(30) Foreign Application Priority Data
Mar. 3, 2000  (JP) ......................................... 2000-059400

(51) Int. Cl.[7] .............................................. C30B 35/00
(52) U.S. Cl. ........................... 117/213; 117/12; 117/208
(58) Field of Search ............................ 117/13, 208, 213

(56) References Cited
U.S. PATENT DOCUMENTS 5,382,419 A * 1/1995 Nagai et al. ................. 423/348
6,308,767 B1 * 10/2001 Hugo et al. ................. 164/22.1

FOREIGN PATENT DOCUMENTS

| JP | U 3012299 | 4/1995 |
| JP | A 8-259378 | 10/1996 |
| JP | Y2 2551383 | 6/1997 |
| JP | A 9-221385 | 8/1997 |
| JP | A 10-182288 | 7/1998 |

* cited by examiner

Primary Examiner—Felisa Hiteshew
(74) Attorney, Agent, or Firm—Oliff & Berridge, PLC

(57) ABSTRACT

The present invention provides a catch pan for melt leakage provided under a crucible at a bottom portion of a chamber in a single crystal pulling apparatus based on the CZ method, wherein the catch pan for melt leakage comprises at least a bottom portion and a barrel portion, and the bottom portion and the barrel portion are connected by screw-fitting or by using a tap bolt. There is provided a catch pan for melt leakage provided in a single crystal pulling apparatus, which can, even if a melt flows out of the crucible by a certain possible cause in a CZ method single crystal pulling apparatus, prevent the melt flowed out from reaching lower mechanisms including metal parts, piping and so forth, and thereby prevent bad influences on operators and peripheral equipments.

12 Claims, 3 Drawing Sheets (a)

(b)

CATCH PAN FOR MELT LEAKAGE IN APPARATUS FOR PULLING SINGLE CRYSTAL

TECHNICAL FIELD

The present invention relates to a structure of an apparatus for pulling a single crystal by the Czochralski method (CZ method), which is for growing a single crystal ingot by the CZ method.

BACKGROUND ART

An example of conventional CZ method single crystal pulling apparatus used for, for example, the production of a semiconductor silicon single crystal will be explained with reference to FIG. 3. As shown in FIG. 3, this CZ method single crystal pulling apparatus 30 is provided with a chamber (pulling chamber) 31, crucible 32 provided in the chamber 31, heater 34 disposed around the crucible 32, crucible holding shaft 33 for rotating the crucible 32 and rotation mechanism therefor (not shown), seed chuck 6 for holding a silicon seed crystal 5, wire 7 for pulling the seed chuck 6, and winding mechanism (not shown) for rotating and winding the wire 7 and constituted by them. AS for the crucible 32, a quartz crucible for accommodating a silicon melt (molten metal) 2 is provided inside, and a graphite crucible is provided outside the quartz crucible. Further, heater insulating material 35 surrounds the outside of the heater 34.

Now, the method for growing a single crystal by using the aforementioned CZ method single crystal pulling apparatus 30 will be explained hereinafter. First, a silicon polycrystal raw material of high purity is melted in the crucible 32 by heating it to a temperature higher than the melting point (about 1420° C.). Then, a tip end of the seed crystal 5 is brought into contact with or immersed into the surface 3 of the silicon melt 2 at its approximate center portion by reeling out the wire 7. Then, the crucible-holding shaft 33 is rotated in an optional direction, and the seed crystal 5 is simultaneously pulled upwardly by winding up the wire 7 with rotating the wire to a direction reverse to the rotation direction of the crucible 32 to start the growing of single crystal. Thereafter, a single crystal ingot 1 approximately in a cylindrical shape can be obtained by appropriately controlling the pulling rate of the wire 7 and the melt temperature.

Although both of the quartz crucible and the graphite crucible provided in the aforementioned single crystal pulling apparatus have high heat resistance, they have a drawback that they are rather brittle and thus shows poor shock resistance. For this reason, when polycrystal raw material is charged in a crucible and melted by heating in pulling of a single crystal, a lump of the polycrystal may collapse during the melting and the crucible may be broken by its impact to generate cracks, through which the melt may leak. Further, while the multiple CZ method is widely used to attain efficient single crystal growth, in which multiple single crystal ingots are obtained from a single quarts crucible by not solidifying the melt after pulling of a single crystal and charging the polycrystal raw material again, it is expected that the silicon melt may flow out of the crucible during the operation because of breakage of the crucible, scattering of the melt and so forth upon the recharging of the polycrystal raw material. Further, although it would be a rare case, if a big quake is brought to the pulling apparatus by earthquake or the like, it is expected that the pulling apparatus is largely swung to right and left and thus the melt in the crucible may flow outside of the crucible. Furthermore, when the crucible has been gradually degraded by use or a single crystal falls during the pulling, the crucible may be broken and the substantially whole amount of the melt contained in the crucible may flow out.

If the melt at a high temperature flows out or scatters to the outside of the crucible as described above, it reaches the bottom of the chamber from the circumference of the crucible and erode the bottom portion of the chamber, metal parts such as terminal area for heater and the crucible holding shaft, crucible driving apparatus, lower piping for cooling water provided for cooling the chamber and so forth. In particular, since the silicon melt heated to a high temperature shows strong erosion action against metals, it is also expected that the piping for cooling water may be eroded. Moreover, the melt overflowed outside of the chamber will harmfully affect operators and facilities.

Therefore, in the single crystal pulling apparatus disclosed in Japanese Patent Laid-open (Kokai) Publication No. 9-221385, for example, it is attempted to obviate such problems by providing a catch pan for melt leakage having an inner volume that can accommodate the whole melted raw material under the crucible, which pan is formed as a seamless pan by integral molding.

However, in such a catch pan for melt leakage, the bottom and side of the pan are completely integrally formed. Therefore, as the single crystal to be grown becomes larger and thus the single crystal pulling apparatus becomes larger, such a pan is becoming extremely expensive in view of its material. Further, in the case that it is integrally formed by press-fitting the bottom portion and side portion of the pan to each other (contacting surfaces are tapered and fitted to each other), the side portion may be lifted up from the fitted position when the press-fitting is not so strong and the silicon melt is accumulated in the catch pan, because the specific gravity of silicon (melt) is 2.54 and specific gravity of graphite is around 1.9. Thus, the melt is highly likely to flow out.

DISCLOSURE OF THE INVENTION

Thus, the present invention is accomplished in view of such problems of the conventional techniques, and its major object is to provide a catch pan for melt leakage provided in a CZ method single crystal pulling apparatus, which can, even if a melt flows out of the crucible by a certain possible cause, prevent the melt flowed out from reaching the lower mechanisms including metal parts, piping and so forth, and thereby prevent bad influences on operators and peripheral equipments.

In order to achieve the aforementioned object, the catch pan for melt leakage in a single crystal pulling apparatus according to the present invention is a catch pan for melt leakage provided under a crucible at a bottom portion of a chamber in a single crystal pulling apparatus based on the Czochralski method, wherein the catch pan for melt leakage comprises at least a bottom portion and a barrel portion, and the bottom portion and a barrel portion are connected by screw-fitting or by using a tap bolt.

If a catch pan for melt leakage is constituted as described above, even a large catch pan can be produced with parts made from smaller raw materials compared with integrally formed product, because it is assembled from at least two parts, the bottom portion and the barrel portion, by screw-fitting or by using a tap bolt. Therefore, material yield of graphite material is markedly improved, and thus the production cost can be reduced. Further, even if the melt flows out of the crucible and accumulates in the catch pan, the catch pan is not separated into each of its parts, for example, the barrel portion does not float, and thus leakage of the melt out of the catch pan can surely be obviated.

In this case, the catch pan for melt leakage can comprise a catch pan body made of graphite material and a heat insulating material adhered to an internal surface of the body.

If the catch pan is constituted as described above, strength and configurational precision of the catch pan is secured by the catch pan body made of the graphite material, and heat transfer from the leaked and accumulated melt at a high temperature is suppressed by the heat insulating material adhered to the internal surface of the body. Thus, thermal load on the chamber can be reduced, and breakage of the chamber can be obviated.

Further, in this case, the graphite material can comprise isotropic graphite, and the heat insulating material can comprise a molding material made of carbon fibers.

If isotropic graphite is used for the graphite material as described above, the catch pan would have excellent strength and heat resistance as well as high configurational precision and excellent configurational stability. Therefore, it can be a catch pan for melt leakage that can be made also by screw-fitting. Further, if a molding material made of carbon fibers is used as the heat insulating material, the heat insulating material can be integrally formed in a shape fitted to the shape of the catch pan body made of graphite material, or it can be easily formed by separately molding each of its parts and jointing them.

Furthermore, in this case, the catch pan for melt leakage preferably has an internal volume that can accommodate at least the whole melted raw material.

In such a case, even if the substantially whole amount of the melt flows into the catch pan due to breakage of the crucible, falling of a single crystal or the like, the melt does not leak out of the catch pan, and thus the lower mechanisms in the chamber or operators and equipments outside the chamber can be protected. In this case, as also understood from the fact that the specific gravity of silicon melt is larger than that of solid silicon, volume expansion of solidified silicon must be sufficiently taken into consideration.

Further, in a single crystal pulling apparatus provided with such a catch pan for melt leakage as described above, even if the melt flows out of the crucible, it can be prevented from reaching the lower mechanisms including metal parts, piping and so forth, and a single crystal can be pulled by a single crystal pulling method utilizing the single crystal pulling apparatus provided with the catch pan for melt leakage without giving bad influences on operators or peripheral equipments.

As explained above in detail, according to the CZ method single crystal pulling apparatus of the present invention, even if a silicon melt flows out of the crucible by a certain possible cause, it can be completely received by the catch pan for melt leakage, which is preferably made of isotropic graphite and adhered with a heat insulating material, and it can be prevented from leaking to the outside. Therefore, there can be obtained an advantage that breakage of chamber can preliminarily be obviated by preventing the melt from reaching metal parts such as piping for cooling water.

Further, since the catch pan for melt leakage is assembled by connecting at least a bottom portion and a barrel portion, raw materials can be easily supplied at a low cost, and it can meet to production of a larger single crystal pulling apparatus. Moreover, since the catch pan has a simple structure and it can be easily produced, the cost can be reduced. Furthermore, since a heat insulating material is attached inside the catch pan, heat quantity effused from the catch pan is small even if melt leakage occurs. Therefore, thermal load on the chamber can be reduced and thus breakage of the chamber and so forth can be obviated.

BEST MODE FOR CARRYING OUT THE INVENTION

Hereafter, embodiments of the present invention will be explained with reference to the appended drawings. However, the present invention is not limited to these.

Figure 1:
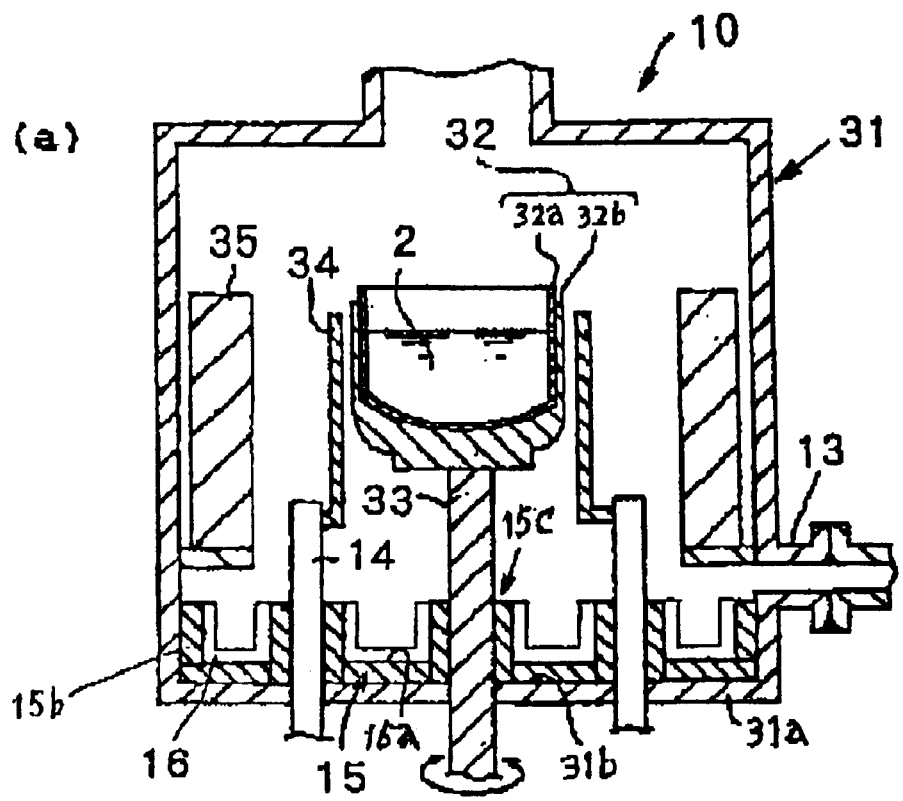
FIG. 1 is an explanatory view showing a single crystal pulling apparatus according to an embodiment of the present invention: (a) schematic sectional view, and (b) partial plan view.
Figure 1:
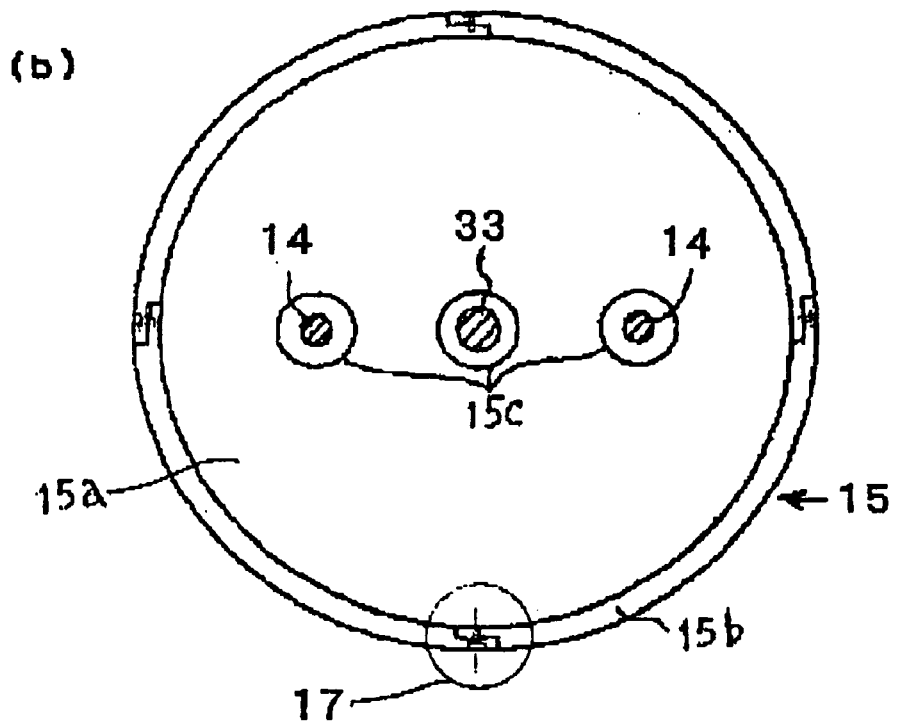
Figure 2:
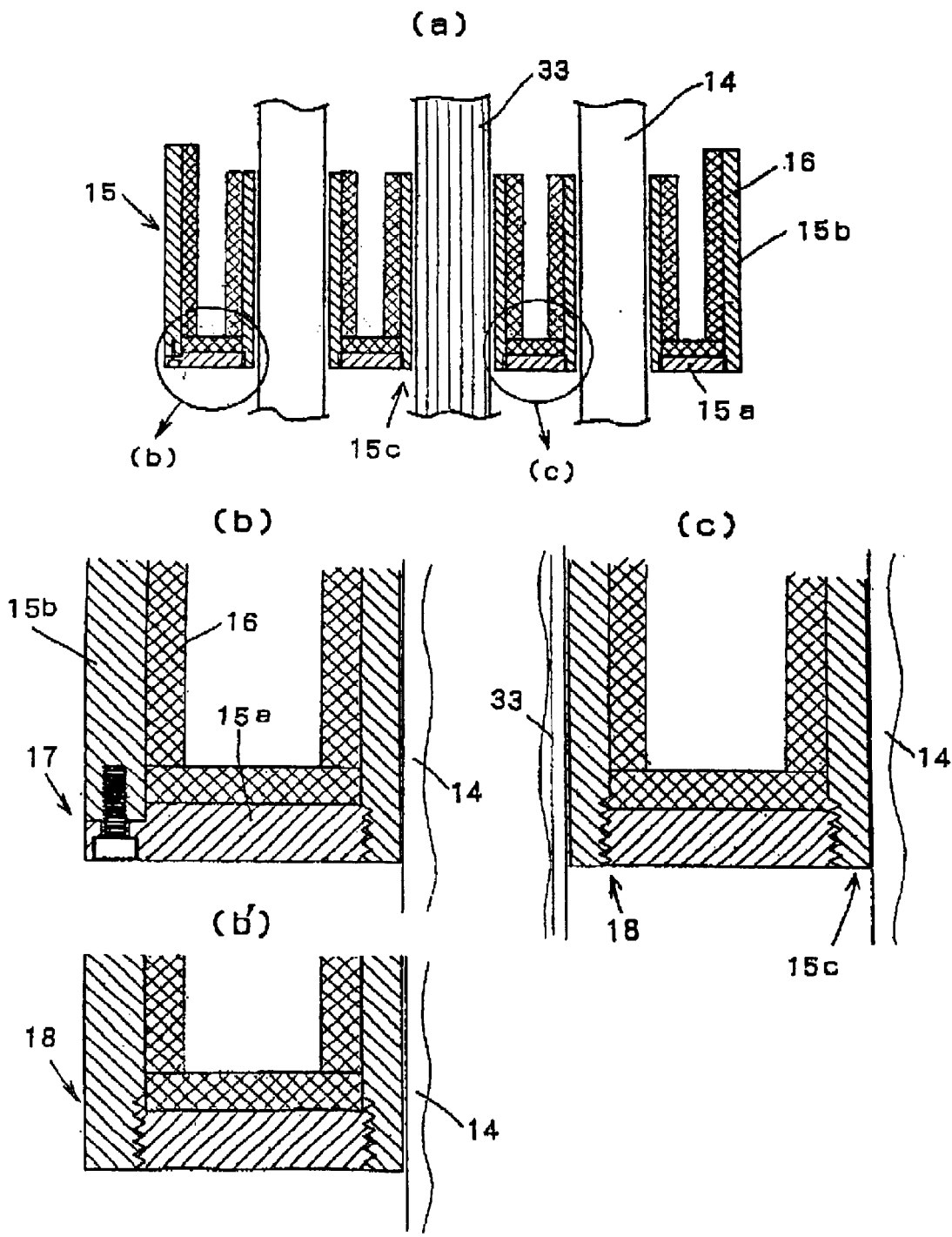
FIG. 2 is an explanatory view showing an example of the catch pan for melt leakage according to an embodiment of the present invention: (a) schematic sectional view of catch pan for melt leakage, (b) partial sectional view showing a connection scheme of a bottom portion and a barrel portion, (b') partial sectional view showing another connection scheme of a bottom portion and a barrel portion, and (c) partial sectional view showing an example of shaft sleeve.
Figure 3:
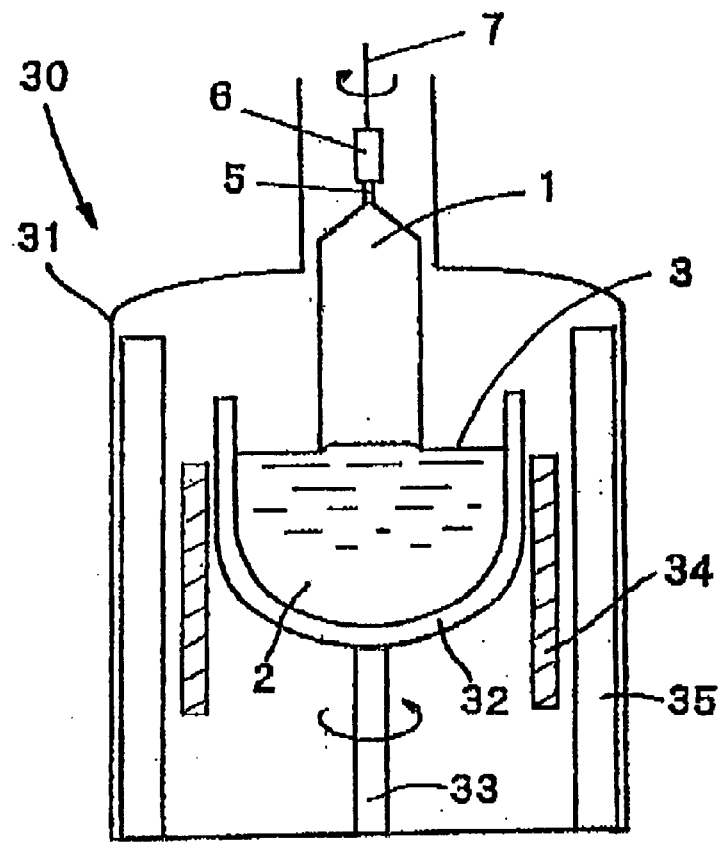
FIG. 3 is an explanatory view showing a single crystal pulling apparatus used in the conventional CZ method.

FIG. 1 (a) is a longitudinal sectional view of an essential part of a single crystal pulling apparatus provided with a catch pan for melt leakage according to the present invention, and FIG. 1 (b) is a partial plan view of a bottom portion. FIG. 2 (a) is a longitudinal sectional view showing an essential part of an example of a catch pan for melt leakage according to the present invention, and FIGS. 2 (b), (b') and (c) are detail views showing the connection schemes of a bottom portion and a barrel portion in catch pans for melt leakage. In the figures, constitutional members having the same functions as in the conventional example are given with the same signs.

As shown in FIG. 1 (a), a chamber 31 of the CZ method single crystal pulling apparatus 10 is of a sealed tank type, and cooling water is flown in piping or jacket (not shown) for cooling water at a peripheral wall. A crucible 32 is provided in the chamber 31, and the apparatus is further provided with a heater 34 disposed around the crucible 32, a crucible holding shaft 33 for rotating the crucible 32 and a rotating mechanism therefor (not shown) and constituted by these members. Further, an atmospheric gas exhausting pipe 13 is provided at a lower position of the chamber 31. Although this exhausting pipe is provided on the lateral side of the chamber, it may be provided in the bottom portion.

As the crucible 32, a quartz crucible 32a is provided inside, i.e., on the side for accommodating the raw material silicon melt (molten metal) 2, and a graphite crucible 32b is provided outside the quartz crucible for protecting it.

Further, there are disposed the heater 34 around the crucible 32 and a heat insulating material 35 for the heater around the heater 34. Metal electrodes 14 for electrifying the heater are provided under the heater 34, and connected to an electric power source provided outside the apparatus. Upper portions of these electrodes 14 may be made of carbon, so that metal portions should not be exposed inside the furnace at a high temperature.

Further, a catch pan for melt leakage 15 according to the present invention is provided in contact with inner wall surface 31b of the bottom portion 31a of the chamber 31.

This catch pan for melt leakage 15 comprises a bottom portion 15a and a barrel portion 15b as shown in FIG. 2 (a), and they are connected at a bolt connection portion 17 (refer to FIG. 2 (b)) or a screw-fitting portion 18 (refer to FIG. 2 (b')). When the catch pan for melt leakage 15 is fitted in the chamber bottom portion 31a, the bottom portion 15a of the catch pan is closely contacted with the substantially whole internal surface of the chamber bottom portion 31b.

In the catch pan for melt leakage 15, shaft sleeves 15c, in which members penetrating the chamber bottom portion 31a and the melt leakage catch pan bottom portion 15a such as the crucible holding shaft 33 and the electrodes 14 for electrifying the heater are passed through, can be assembled with the bottom portion 15a by screwing (refer to FIG. 2 (c)) to secure sufficient strength and sealing. They preferably have the same height as the barrel portions 15b, and the inner volume of the catch pan 15 for melt leakage, which is defined by the bottom portions 15a and the barrel portion 15b, is determined so that it should be larger than the volume of the total melted raw material 2.

When the shaft sleeves 15c have a height lower than that of the barrel portions 15b, it is preferred that the inner volume of the catch pan defined by the height from the bottom to the upper ends of the shaft sleeves should be larger than the volume of the total melted raw material.

When the inner volume is determined, it is better to take into consideration that the specific gravity of silicon melt is larger than that of solidified solid silicon. That is, the specific gravity of silicon melt is about 2.54, and that of solid silicon is 2.33. Therefore, if a part of leaked melt is solidified, its volume expands. Accordingly, the inner volume of the catch pan for melt leakage is preferably larger than the volume of the total melt raw material observed when it is solidified.

As the material of the catch pan for melt leakage 15, graphite materials are suitable from the viewpoints of heat resistance, corrosion resistance and workability. Inter alia, isotropic graphite is preferred. If isotropic graphite is used for the graphite material as described above, the catch pan would have, in particular, excellent strength and heat resistance. Thus, generation of cracks and so forth due to thermal shock given by leakage of melt and so forth can be prevented. At the same time, high configurational precision, excellent configurational stability and excellent workability can be obtained, and thus the catch pan can be assembled by screwing so that it should not suffer from leakage of the melt.

Since the catch pan for melt leakage 15 of the present invention comprises the bottom portion 15a and barrel portion 15b and they are connected by screw-fitting or by using a tap bolt as described above, the catch pan shows advantages different from those of an integrally formed seamless product.

First, since it can comprise of at least three members, which are the bottom portion, the barrel portion and the shaft sleeve, it is not required to use extremely large graphite raw materials for the members, and each member can be easily produced. Therefore, the cost can be reduced. Furthermore, if the bottom portion and the barrel portion are each designed to be constituted by a plurality of members and assembled by using tap bolts, it will be more effective. For example, in FIG. 1 (b), the barrel portion is constituted by four members, and they are assembled at tap bolt connection portions 17.

Further, since it is constituted by separated members, it has also an advantage that, when a part of the members is damaged, it is sufficient to change only the damaged member.

A further characteristic of the catch pan for melt leakage 15 of the present invention is that the heat insulating material 16 is adhered on the internal surface of the catch pan body, and the heat insulating material is constituted by a molding material made of carbon fibers.

If a molding material made of carbon fibers is used for the heat insulating material, a molding material fitted to the shapes of the body of the catch pan for melt leakage made of graphite and the shaft sleeve can be easily produced. Further, the molded product made of carbon fibers can be formed as an integrally molded product or a product obtained by separately forming members and connecting them. Since the heat insulating material is adhered, heat loss from the melt at a high temperature, which has leaked from the crucible and accumulated, is reduced, and thus thermal load on the chamber can be reduced. Therefore, damages of the chamber can be prevented.

In the single crystal pulling apparatus 10 constituted as described above, the silicon polycrystal raw material charged in the crucible 32 is melted by the heater 34 to form the melted raw material 2. A seed crystal attached to a seed holder suspended by a wire from above is immersed into the melted raw material 2, and then while rotating the wire and the crucible 32, the seed crystal is pulled at a predetermined rate. Thereby, a predetermined single crystal ingot 1 can be grown.

In the aforementioned single crystal pulling apparatus 10, if cracks are generated in the crucible 32 by an impact caused by charging of the polycrystal raw material when the polycrystal raw material is charged into the crucible 32, for example, the melt 2 flows out of the crucible 32 through the cracks and the melt 2 flowed out runs downwardly on the outer surface of the crucible and falls to the bottom portion 31a of the chamber 31.

In such a case, according to the single crystal pulling apparatus 10 provided with the catch pan for melt leakage 15 of the present invention, the catch pan for melt leakage 15 is disposed in contact with the internal wall surface 31b of the bottom portion of the chamber, and therefore the melt 2 flowed out can be accommodated by the catch pan for melt leakage 15. In addition, since the catch pan for melt leakage 15 is formed by assembling the bottom portion 15a and the side portion 15b by screw-fitting or by using tap bolts so as not to form any gap, the accommodated melt 2 does not flow out to another site. Further, since the catch pan for melt leakage 15 has an inner volume that can accommodate the whole quantity of the melted raw material 2, the accommodated melt 2 does not overflow from the catch pan for melt leakage 15. Therefore, the melt 2 can surely be prevented from reaching the lower mechanisms of the crucible 32, and the melt flowed out can surely be prevented from overflowing from the chamber of the pulling apparatus to badly affect operators.

Hereafter, the present invention will be specifically explained with reference to the following examples of the present invention. However, the present invention is not limited to these.

EXAMPLE 1

Comparative Example

Effectiveness of the connection scheme between a bottom portion and a barrel portion of a catch pan for melt leakage was examined.

Figure 4:
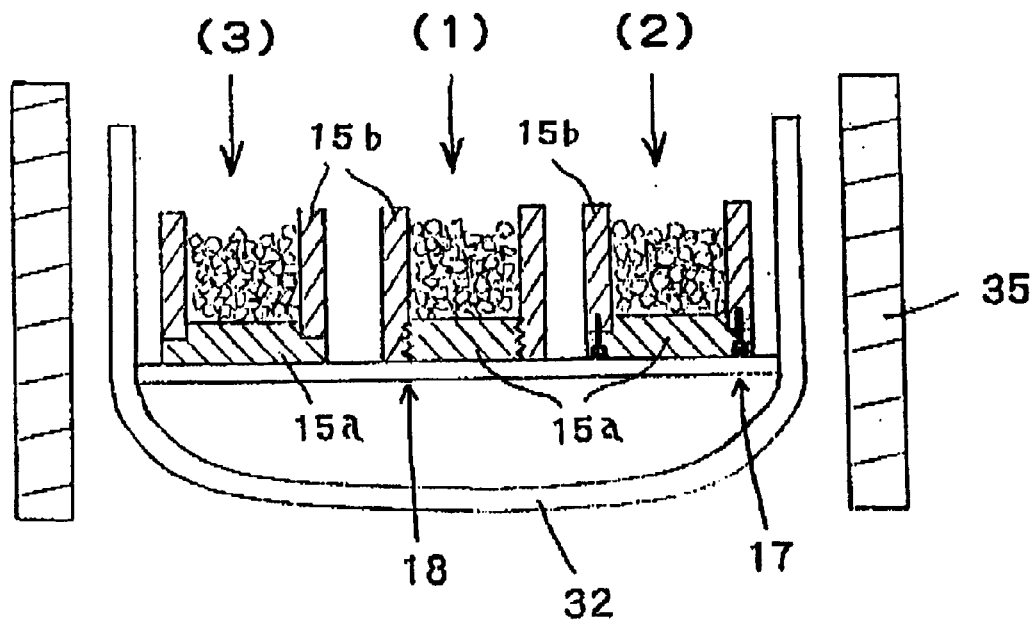
FIG. 4 is an explanatory view showing an experimental method for examining the effectiveness of the connection schemes of a bottom portion and a barrel portion in catch pans for melt leakage used in Example 1 and Comparative Example.

As shown in FIG. 4, miniatures of three kinds of catch pan for melt leakage were produced from isotropic graphite material for different connection schemes of the bottom portion and the barrel portion, and horizontally provided in a quartz crucible having a diameter of 24 inches in a single crystal pulling apparatus. Granular polycrystal raw material was charged in each of the catch pans for melt leakage, heated by a heater and maintained at 1450° C. for 1 hour to investigate presence or absence of leakage of the melt.

As for the connection scheme of the bottom portion and the barrel portion of the catch pans for melt leakage, the bottom portion was screwed into the barrel portion as Example 1 (1) (screw-fitting scheme), the bottom portion was connected to the barrel portion by using tap bolts as Example 1 (2), and the bottom portion was fitted into the barrel portion as comparative Example (3).

As a result of the test, in the fitting scheme of Comparative Example (3), small gaps were formed at the fitted portion and thus the melt leaked. On the other hand, in the cases of (1) and (2), leakage to the outside was not observed at all.

EXAMPLE 2

In this example, such a catch pan for melt leakage 15 adhered with a heat insulating material 16 as shown in FIG. 1 was produced and installed on a single crystal pulling apparatus to examine effectiveness of the catch pan for melt leakage. Material of catch pan for melt leakage: isotropic graphite, internal volume of catch pan (including the volume of heat insulating material of 24700 cm$^3$): 128000 cm$^3$, volume of silicon melt: 59000 cm$^3$ (150 kg of silicon): connection scheme of bottom portion and barrel portion of catch pan for melt leakage: the scheme in which the bottom portion is screw-fitted into the barrel portion.

An amount of 150 kg of polycrystal silicon was charged into a 24-inch quartz crucible and melting was started. However, cracks were generated in the quartz crucible immediately after about 80% of the material was melted, and thus the melt leaked. At that time, the temperature of the cooling water for cooling the internal wall 31b of the bottom portion of the chamber was increased by 1.2° C. (piping for cooling water is not shown). However, any particular problem was not observed, and heat insulating effect of the heat insulating material 16 was sufficient.

After the operation was stopped and the inside of the furnace was cooled, the furnace was dismounted and examined. As a result, about 80 kg of silicon was solidified in the catch pan for melt leakage 15, and no trace of leakage of the melt outside the catch pan for melt leakage 15 was observed, although penetration of silicon was observed within about one inner screw thread at the screw-fitted portion 18 (refer to FIG. 2 (c)). Thus, effectiveness of the catch pan for melt leakage was confirmed.

The present invention is not limited to the embodiments described above. The above-described embodiments are mere examples, and those having the substantially same structure as that described in the appended claims and providing similar functions and advantages are all included in the scope of the present invention.

For example, while the present invention was explained by exemplifying growing of a silicon single crystal, the present invention is not limited only to the production of a silicon single crystal. The present invention can be applied to any of single crystal growing apparatuses, and it can of course be used for single crystal growing apparatuses for compound semiconductors using the LEC method and so forth.

What is claimed is:

1. A catch pan for melt leakage provided under a crucible at a bottom portion of a chamber in a single crystal pulling apparatus based on the Czochralski method, wherein the catch pan for melt leakage comprises at least a bottom portion and a barrel portion, and the bottom portion and the barrel portion are connected by screw-fitting or by using a tap bolt.

2. The catch pan for melt leakage in a single crystal pulling apparatus according to claim 1, wherein the catch pan for melt leakage comprises a catch pan body made of graphite material and a heat insulating material adhered to an internal surface of the body.

3. The catch pan for melt leakage in a single crystal pulling apparatus according to claim 2, wherein the graphite material comprises isotropic graphite, and the heat insulating material comprises a molding material made of carbon fibers.

4. The catch pan for melt leakage in a single crystal pulling apparatus according to claim 3, wherein the catch pan for melt leakage has an internal volume that can accommodate at least the whole melted raw material.

5. A single crystal pulling apparatus wherein the apparatus is provided with the catch pan for melt leakage according to claim 4.

6. A single crystal pulling apparatus wherein the apparatus is provided with the catch pan for melt leakage according to claim 3.

7. The catch pan for melt leakage in a single crystal pulling apparatus according to claim 2, wherein the catch pan for melt leakage has an internal volume that can accommodate at least the whole melted raw material.

8. A single crystal pulling apparatus wherein the apparatus is provided with the catch pan for melt leakage according to claim 7.

9. A single crystal pulling apparatus wherein the apparatus is provided with the catch pan for melt leakage according to claim 2.

10. The catch pan for melt leakage in a single crystal pulling apparatus according to claim 1, wherein the catch pan for melt leakage has an internal volume that can accommodate at least the whole melted raw material.

11. A single crystal pulling apparatus wherein the apparatus is provided with catch pan for melt leakage according to claim 10.

12. A single crystal pulling apparatus wherein the apparatus is provided with the catch pan for melt leakage according to claim 1.

* * * * *